United States Patent
Wu et al.

(10) Patent No.: US 7,055,263 B2
(45) Date of Patent: Jun. 6, 2006

(54) METHOD FOR CLEANING DEPOSITION CHAMBERS FOR HIGH DIELECTRIC CONSTANT MATERIALS

(75) Inventors: Dingjun Wu, Macungie, PA (US); Bing Ji, Allentown, PA (US); Stephen Andrew Motika, Kutztown, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 47 days.

(21) Appl. No.: 10/721,719

(22) Filed: Nov. 25, 2003

(65) Prior Publication Data

US 2005/0108892 A1    May 26, 2005

(51) Int. Cl.
*F26B 3/34*    (2006.01)

(52) U.S. Cl. .......................................... 34/443; 34/245

(58) Field of Classification Search ................ 34/444, 34/443, 259, 266, 275, 248, 250, 255, 245; 134/1.1, 1.2, 1.3; 156/345.4, 345.5, 345.41, 156/345.93, 395.98
See application file for complete search history.

(56) References Cited

U.S. PATENT DOCUMENTS

| | | | |
|---|---|---|---|
| 4,786,352 A * | 11/1988 | Benzing | 156/345.48 |
| 5,288,662 A | 2/1994 | Lagendijk et al. | |
| 5,298,075 A | 3/1994 | Lagendijk et al. | |
| 5,356,478 A | 10/1994 | Chen et al. | |
| 5,454,903 A | 10/1995 | Redeker et al. | |
| 5,756,400 A | 5/1998 | Ye et al. | |
| 5,817,578 A | 10/1998 | Ogawa | |
| 5,879,459 A | 3/1999 | Gadgil et al. | |
| 5,914,050 A | 6/1999 | Comita et al. | |
| 5,972,722 A | 10/1999 | Visokay et al. | |
| 6,174,377 B1 | 1/2001 | Doering et al. | |
| 6,211,035 B1 | 4/2001 | Moise et al. | |
| 6,221,169 B1 * | 4/2001 | Bernstein et al. | 134/2 |
| 6,238,582 B1 | 5/2001 | Williams et al. | |
| 6,387,185 B1 | 5/2002 | Doering et al. | |
| 6,686,594 B1 * | 2/2004 | Ji et al. | 250/373 |

(Continued)

FOREIGN PATENT DOCUMENTS

EP    0 855 453    7/1998

(Continued)

OTHER PUBLICATIONS

K. K. Shih, "Hafnium Dioxide Etch-Stop Layer for Phase-Shifting Masks," J. Vac. Sci. Technol. B 11(6), pp. 2130-2131(1993).

(Continued)

*Primary Examiner*—Kenneth Rinehart
(74) *Attorney, Agent, or Firm*—Rosaleen P. Morris-Oskanian

(57) ABSTRACT

A method for dry etching and chamber cleaning high dielectric constant materials is disclosed herein. In one aspect of the present invention, there is provided a process for cleaning a substance comprising a dielectric constant greater than the dielectric constant of silicon dioxide from at least a portion of a surface of a reactor comprising: introducing a first gas mixture comprising a boron-containing reactive agent into the reactor wherein the first gas mixture reacts with the substance contained therein to provide a volatile product and a boron-containing by-product; introducing a second gas mixture comprising a fluorine-containing reactive agent into the reactor wherein the second gas mixture reacts with the boron-containing by-product contained therein to form the volatile product; and removing the volatile product from the reactor.

21 Claims, 4 Drawing Sheets

U.S. PATENT DOCUMENTS

| | | | |
|---|---|---|---|
| 2001/0008138 A1 | 7/2001 | Demos et al. | |
| 2001/0011526 A1 | 8/2001 | Doering et al. | |
| 2001/0055852 A1 | 12/2001 | Moise et al. | |
| 2003/0098419 A1* | 5/2003 | Ji et al. | 250/373 |
| 2004/0011380 A1* | 1/2004 | Ji et al. | 134/1.1 |
| 2004/0014327 A1* | 1/2004 | Ji et al. | 438/722 |

FOREIGN PATENT DOCUMENTS

| | | |
|---|---|---|
| EP | 0 871 211 | 10/1998 |
| EP | 1 001 459 A2 | 5/2000 |
| EP | 1 382 716 | 1/2004 |
| JP | 02 185977 | 10/1990 |
| WO | WO 00/40772 | 7/2000 |
| WO | WO 00/79019 A1 | 12/2000 |
| WO | WO 02/43114 A2 | 5/2002 |
| WO | WO 02/43115 A2 | 5/2002 |

OTHER PUBLICATIONS

J. A. Britten, "Etch-Stop Characteristics of $Sc_2O_3$ and $HfO_2$ Films for . . . ," J. Vac Sci. Technol. A 14(5), pp. 2973-2975 (1996).

J. Hong, "Comparison of $Cl_2$ and $F_2$ Based Chemistries for the . . . ," J. Vac. Sci. Technol. A 17 (4), pp. 1326-1330 (1999).

J. W. Lee, "Electron Cyclotron Resonance Plasma Etching of Oxides . . . ," J. Vac Sci. Technol. A 16(3), pp. 1944-1948.

W. G. M. van den Hoek, "The Etch Mechanism for Al2O3 in Fluorine and Chlorine Based RF Dry Etch Plasma," Mat. Res. Soc. Symp. Proc., 68, pp. 71-78 (1986).

J. E. Spencer, et al., "Emission Spectroscopy of CC14 and BC13 Plasma During Aluminum Etchning," Proceedings—Electrochemical Society, 82-7, pp. 103-107 (1982).

T. Kanniainen, et al, "Growth of Dielectric $HfO_2/Ta_2O_5$ Thin Film Nanolaminate Capacitors by Atomic Layer Epitaxy," Proceedings—Electrochemical Society, 97-31, pp. 36-46 (1998).

H. B. Bell, et al., "Reactive Ion Etching of Aluminum/Silicon in $BBr3/Cl_2$ and $BCl_3/Cl_2$ Mixtures," Journal of Electrochemical Society, 135(5), pp. 1184-91 (1988).

Y. S. Lee, et al., "Mass Spectrometric Characterization of $BCl_3/SF_6$ Plasmas," Journal of Applied Physics, 88(8), pp. 4507-4509 (1980).

N. Heiman, et al., "High Rate Reactive Ion Etching of $Al_2O_3$ and Si," J. Vac. Sci. Technol., 17(3), pp. 731-734 (1980).

K. Shibata, et al., "Manufacturing Method and its Equipment of Thin Film Magnetic Head," Japanese Patent Application JP2000251221A (2000).

J Chen, et al., "Formation of Polycrystalline Silicon Germanium/$HfO_2$ Gate Stack Structure Using Inductively Coupled Plasma Etching," J. Vac. Sci. Technol. A 21(4), pp. 1210-1217 (2003).

* cited by examiner

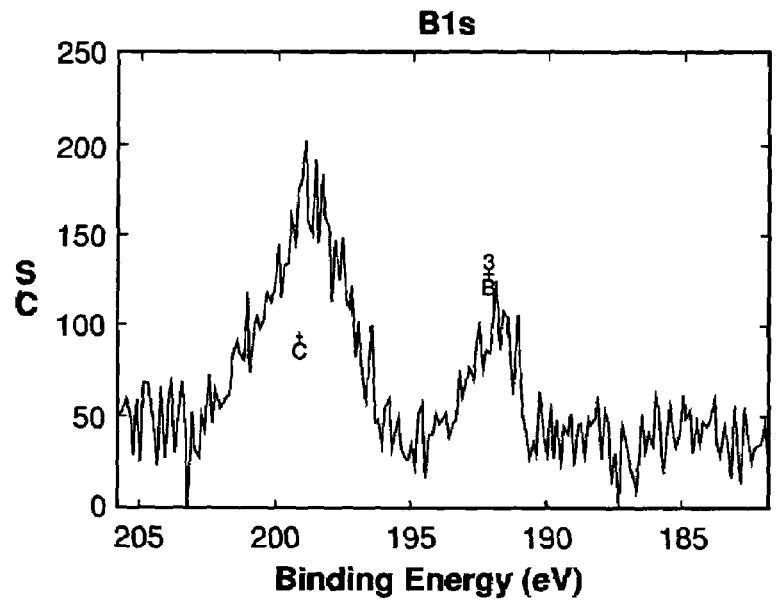
Figure 2a: High-resolution spectrum for $Al_2O_3$ after one-step cleaning using $BCl_3$
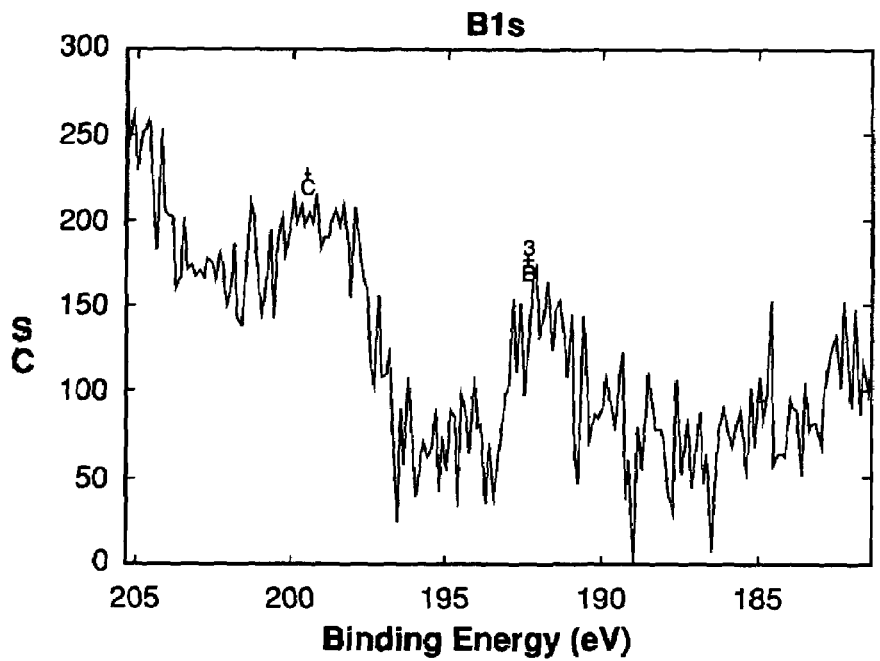
Figure 2b: High-resolution spectrum for $HfO_2$ after one-step cleaning using $BCl_3$

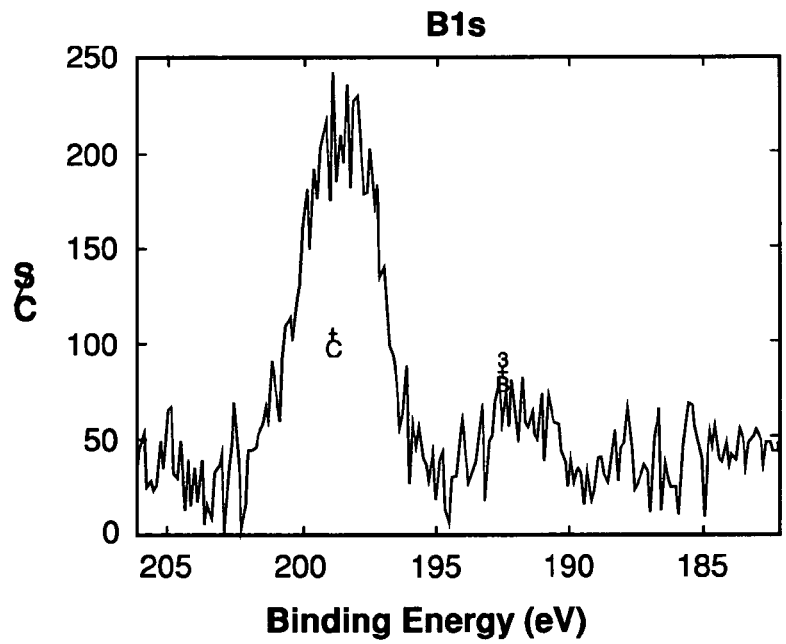
Figure 3a: High-resolution spectrum for $Al_2O_3$ after one-step cleaning using $BCl_3$ and $NF_3$
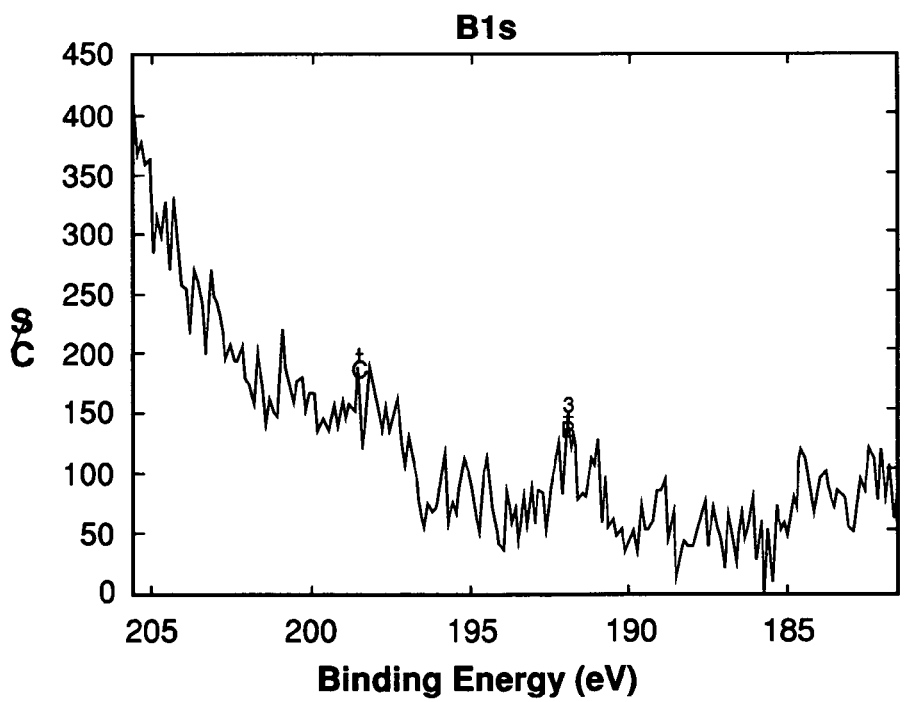
Figure 3b: High-resolution spectrum for $HfO_2$ after one-step cleaning using $BCl_3$ and $NF_3$

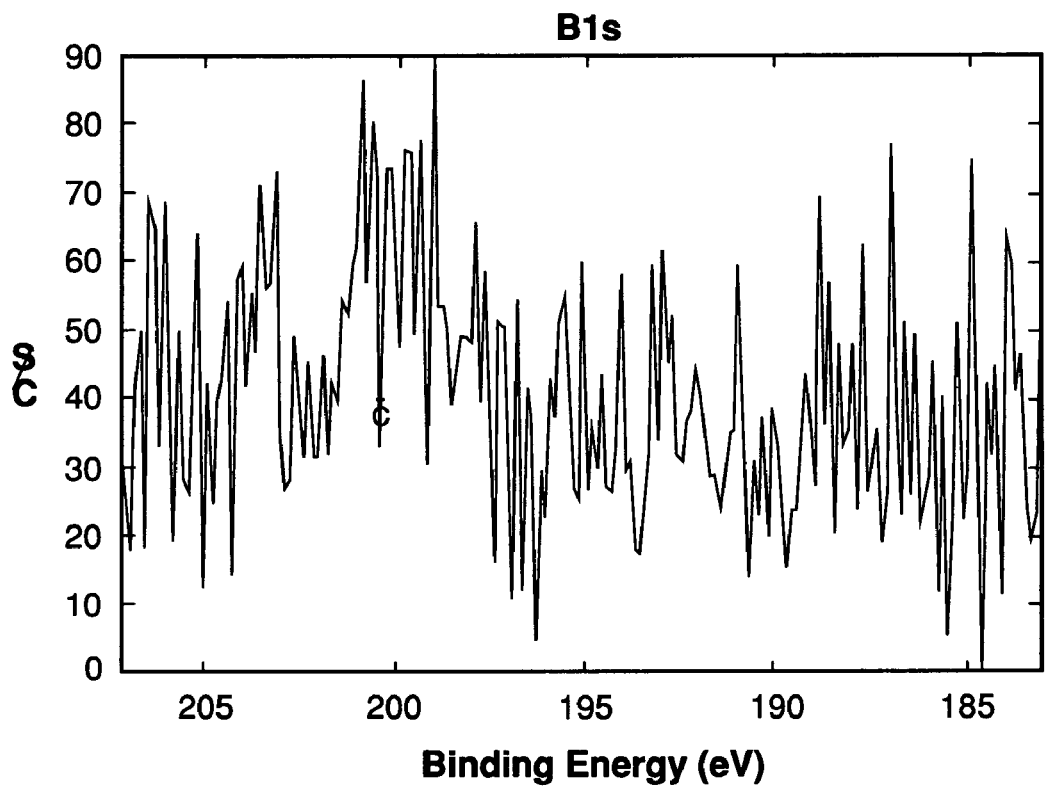
Figure 4a: High-resolution spectrum for $Al_2O_3$ after two-step cleaning
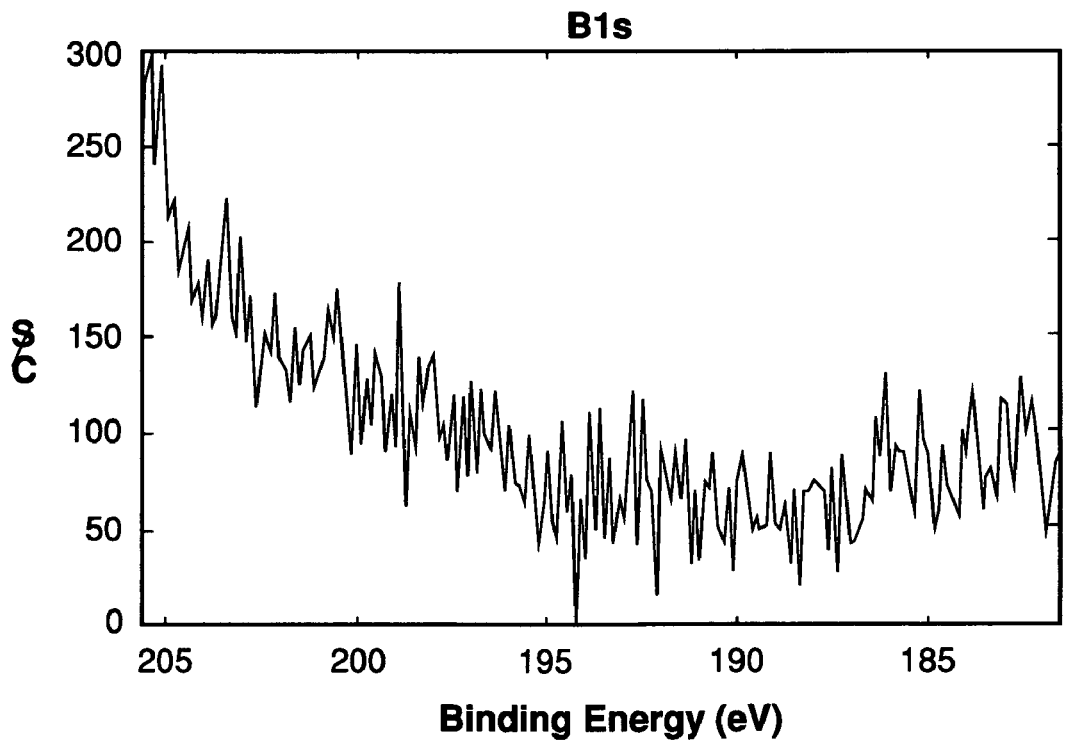
Figure 4b: High-resolution spectrum for $HfO_2$ after two-step cleaning

METHOD FOR CLEANING DEPOSITION CHAMBERS FOR HIGH DIELECTRIC CONSTANT MATERIALS

BACKGROUND OF THE INVENTION

In the manufacture of semiconductor integrated circuits (IC), dielectric materials such as silicon dioxide ($SiO_2$), silicon nitride ($Si_3N_4$), and silicon oxynitride (SiON) have been widely used as insulators for transistor gates. Such insulators are often called gate dielectrics. As IC device geometry shrinks, gate dielectric layers have become progressively thinner. When the gate dielectric layer approaches thicknesses of a few nanometers or less, conventional $SiO_2$, $Si_3N_4$, and SiON materials undergo electric breakdown and no longer provide insulation. To maintain adequate breakdown voltage at very small thickness ($\leq 10$ nm), high dielectric constant materials can be used as the gate insulating layer. The term "high dielectric constant materials", as used herein, describe materials where the dielectric constant is greater than about 4.1, or the dielectric constant of silicon dioxide. In addition, high dielectric constant materials can also be used as the barrier layer in deep trench capacitors for semiconductor memory chip manufacturing. The IC industry has experimented with many high dielectric constant materials. The latest and most promising high dielectric constant materials are metal oxides such as $Al_2O_3$, $HfO_2$, $ZrO_2$, and mixtures thereof, and metal silicates such as $HfSi_xO_y$, $ZrSi_xO_y$, and mixtures thereof. In some instances, nitrogen may be incorporated into these metal oxides and metal silicates high dielectric constant materials (such as HfSiON or AlSiON) to improve the dielectric constant and to suppress crystallization of high dielectric constant materials. For example, crystallization of high dielectric constant materials such as $HfO_2$ causes high leakage current and device failure. Therefore, incorporation of nitrogen can dramatically improve the device reliability. In other instances laminate structures of two or more of the above mentioned materials are deposited as the high k dielectric layer. For example, a laminate structure of $Al_2O_3$ followed by $HfO_2$ is being employed as the barrier layer in deep trench capacitors.

High dielectric constant materials such as $Al_2O_3$, $HfO_2$, and $ZrO_2$ are very stable and resistive against most of the etching reactions, which has led to their use as etch stop layers and hard mask layers in plasma etching of other materials. See, e.g., K. K. Shih et al., "Hafnium dioxide etch-stop layer for phase-shifting masks", J. Vac. Sci. Technol. B 11(6), pp. 2130–2131 (1993); J. A. Britten, et al., "Etch-stop characteristics of $Sc_2O_3$ and $HfO_2$ films for multilayer dielectric grating applications", J. Vac. Sci. Technol. A 14(5), pp. 2973–2975 (1996); J. Hong et al., "Comparison of $Cl_2$ and $F_2$ based chemistries for the inductively coupled plasma etching of NiMnSb thin films", J. Vac. Sci. Technol. A 17(4), pp. 1326–1330 (1999); U.S. Pat. No. 5,972,722 to Visokay et al.; U.S. Pat. No. 6,211,035 B1 to Moise et al., U.S. Patent Application Publication US2001/0055852 A1 to Moise et al.; and EP 1,001,459 A2 to Moise et al.

These high dielectric constant materials are typically deposited from chemical precursors that react in a deposition chamber to form films in a chemical vapor deposition (CVD) process. In some instances, these high dielectric constant materials are deposited onto semiconductor substrates (wafers) by atomic layer deposition (ALD), in which the films are deposited in controlled, nearly monoatomic layers. Apparatus and processes for performing ALD are disclosed in, e.g., U.S. Pat. No. 5,879,459 to Gadgil et al., U.S. Pat. No. 6,174,377 B1 to Doering et al., U.S. Patent Application Publication US2001/0011526 A1 to Doering et al., U.S. Pat. No. 6,387,185 B2 to Doering et al., WO 00/40772 to Doering et al. and WO 00/79019 A1 to Gadgil et al. This family of patents assigned to Genus, Inc. teach that "In situ plasma cleans allow the realization of a very long time between maintenance cleaning." (See, e.g., U.S. Pat. No. 6,387,185 B2 at column 7, lines 27–28.) However, no details of any process for plasma cleaning of ALD chambers were given in the above family of disclosures.

Plasma sources have been used to enhance atomic layer deposition processes (PE-ALD). For example, Pomarede et al. in WO 02/43115 A2 teach the use of plasma sources to generate excited reactive species that prepare/activate the substrate surface to facilitate subsequent ALD. Nguyen et al. in WO 02/43114 A2 teach the use of a pulsing plasma to enact ALD processes instead of alternating precursor chemical flows. Again, these publications do not disclose any method to clean the ALD residues after the wafers have been processed.

While the deposition process desirably generates high dielectric constant films on a substrate (typically a silicon wafer), the reactions that form these films also occur nonproductively on other exposed surfaces inside of the deposition chamber. Accumulation of deposition residues results in particle shedding, degradation of deposition uniformity, and processing drifts. These effects can lead to wafer defects and subsequent device failure. Therefore, all CVD chambers, and specifically ALD chambers, must be periodically cleaned.

Various references discuss adding certain compounds to the plasma in order to effect the etch rate of $Al_2O_3$. The references, W. G. M. Van Den Hoek, "The Etch Mechanism for $Al_2O_3$ in Fluorine and Chlorine Based RF Dry Etch Plasmas". Met. Res. Soc. Symp. Proc. Vol. 68 (1986), pp. 71–78 and Heiman, et al., "High Rate Reactive Ion Etching of $Al_2O_3$ and Si", J. Vac. Sci. Tech., 17(3), May/June 1980, pp. 731–34, disclose adding a fluorine based gas or a chlorine based gas, respectively, to an Ar plasma to increase the etch rate of $Al_2O_3$. However, these studies were all under the reactive ion etch (RIE) conditions. Ion bombardment/sputter induced reactions play a much large role than chemical etching reactions. Like other prior arts, such extreme RIE conditions do not apply to cleaning grounded chamber surfaces.

In view of the dearth of art disclosing methods for removing high dielectric constant residues, ALD and CVD reactors have typically been cleaned by mechanical means (scrubbing or blasting) to clean up the deposition residues from the internal surfaces of the chamber and downstream equipment (e.g. pump headers and exhaust manifolds). However, mechanical cleaning methods are time-consuming, labor-intensive, and damaging to the surfaces being cleaned.

Other than using mechanical means (scrubbing or blasting) and/or wet chemicals to clean up the deposition residues from the internal surfaces of the chamber, a dry-cleaning process has been developed by using a Cl-containing reactive agent, where $BCl_3$ is one of the preferred Cl-containing compounds. It is believed that $BCl_3$ is a particularly effective cleaning agent for removing high dielectric constant deposition residues due to two synergistic chemical mechanisms. First, boron atoms may act as an oxygen scavenger to assist in breaking the metal-oxygen bonds. Second, chlorine atoms can react with the metal atoms to form species that are more volatile than the corresponding metal oxides. Even though this process can effectively remove the high dielectric constant material residues inside the chamber, it can also generate boron-containing solid byproducts, such as $B_2O_3$. Boron residues can act as a p-type dopant and may cause contaminations problems to integrated circuits. Further, its deposition on the vacuum lines can also cause vacuum equipment failure. Thus, the removal of the boron-containing residues is necessary to ensure product quality and equipment integrity.

Fluorine-containing plasma-based processes (i.e., dry cleaning) are commonly used to remove residues of silicon compounds (such as polycrystalline silicon, $SiO_2$, $SiON$, and $Si_3N_4$) and tungsten from the interior surfaces of chemical vapor deposition (CVD) reactors. In these processes, fluorine reacts with the aforementioned residues to produce, for example, $SiF_4$ or $WF_6$, volatile species that can be pumped out of the reactor during the cleaning process. However, fluorine-based chemistry alone is ineffective in removing the high dielectric constant materials discussed above. See, e.g., J. Hong et al., J. Vac. Sci. Technol. A, Vol. 17, pp 1326–1330, 1999, wherein the authors exposed $Al_2O_3$ coated wafers to $NF_3$/Ar based inductively coupled plasmas, and found that "the greater concentration of atomic F available at high source power contributed to thicker fluorinated surfaces, leading to the net deposition rather than etching." In the case of high dielectric constant materials the metal fluoride product that forms is nonvolatile and, thus, difficult to remove from the reactor.

Thus, there is an urgent need for a process to chemically dry clean high dielectric constant material residues, such as $Al_2O_3$, $HfO_2$, $ZrO_2$, $HfSi_xO_y$, $ZrSi_xO_y$ and mixtures thereof, residues of laminates containing high dielectric constant materials such as $HfO_2$ and $Al_2O_3$ (also referred to as HfAlO), and residues from nitrogen containing high dielectric constant materials such as HfON, AlON, and laminated materials between HfON and AlON (HfAlON), from ALD reactors without venting/opening up the reactor. An effective chemical dry cleaning method will significantly increase the productivity and lower the cost-of-ownership (CoO) for ALD-based deposition processes.

All references cited herein are incorporated herein by reference in their entireties.

BRIEF SUMMARY OF THE INVENTION

A multiple-step process for the removal of a substance from a substrate is disclosed herein. In one aspect of the invention, there is provided a process for cleaning a substance comprising a dielectric constant greater than the dielectric constant of silicon dioxide from at least a portion of a surface of a reactor comprising: introducing a first gas mixture comprising a boron-containing reactive agent into the reactor wherein the first gas mixture reacts with the substance contained therein to provide a volatile product and a boron-containing by-product; introducing a second gas mixture comprising a fluorine-containing reactive agent into the reactor wherein the second gas mixture reacts with the boron-containing by-product contained therein to form the volatile product; and removing the volatile product from the reactor.

In another aspect of the invention, there is provided a process for removing a substance from at least a portion of the surface of a reactor, the process comprising: providing a reactor wherein at least a portion of the surface is at least partially coated with the substance and wherein the substance has a dielectric constant of 4.1 or greater and is at least one member of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate; introducing a first gas mixture comprising a boron-containing reactive agent into the reactor; exposing the first gas mixture to one or more energy sources sufficient to generate active species that react with the substance and form a volatile product and a boron-containing byproduct; and introducing a second gas mixture comprising a fluorine-containing reactive agent into the reaction reactor; exposing the second gas mixture to one or more energy sources sufficient generate active species that react with the boron-containing byproduct and form the volatile product; and removing the volatile product from the reactor.

These and other aspects of the invention will become apparent from the following detailed description.

BRIEF DESCRIPTION OF SEVERAL VIEWS OF THE DRAWINGS

FIGS. 2a and 2b provide high resolution spectra prepared via XPS for $Al_2O_3$ and $HfO_2$, respectively, after cleaning using $BCl_3$.

FIGS. 3a and 3b provide high resolution spectra prepared via XPS for $Al_2O_3$ and $HfO_2$, respectively, after cleaning using $BCl_3$ and $NF_3$ in one step.

FIGS. 4a and 4b provide high resolution spectra prepared via XPS for $Al_2O_3$ and $HfO_2$, respectively, after cleaning using $BCl_3$ in the first step and $NF_3$ in the second step.

DETAILED DESCRIPTION OF THE INVENTION

Figure 1:
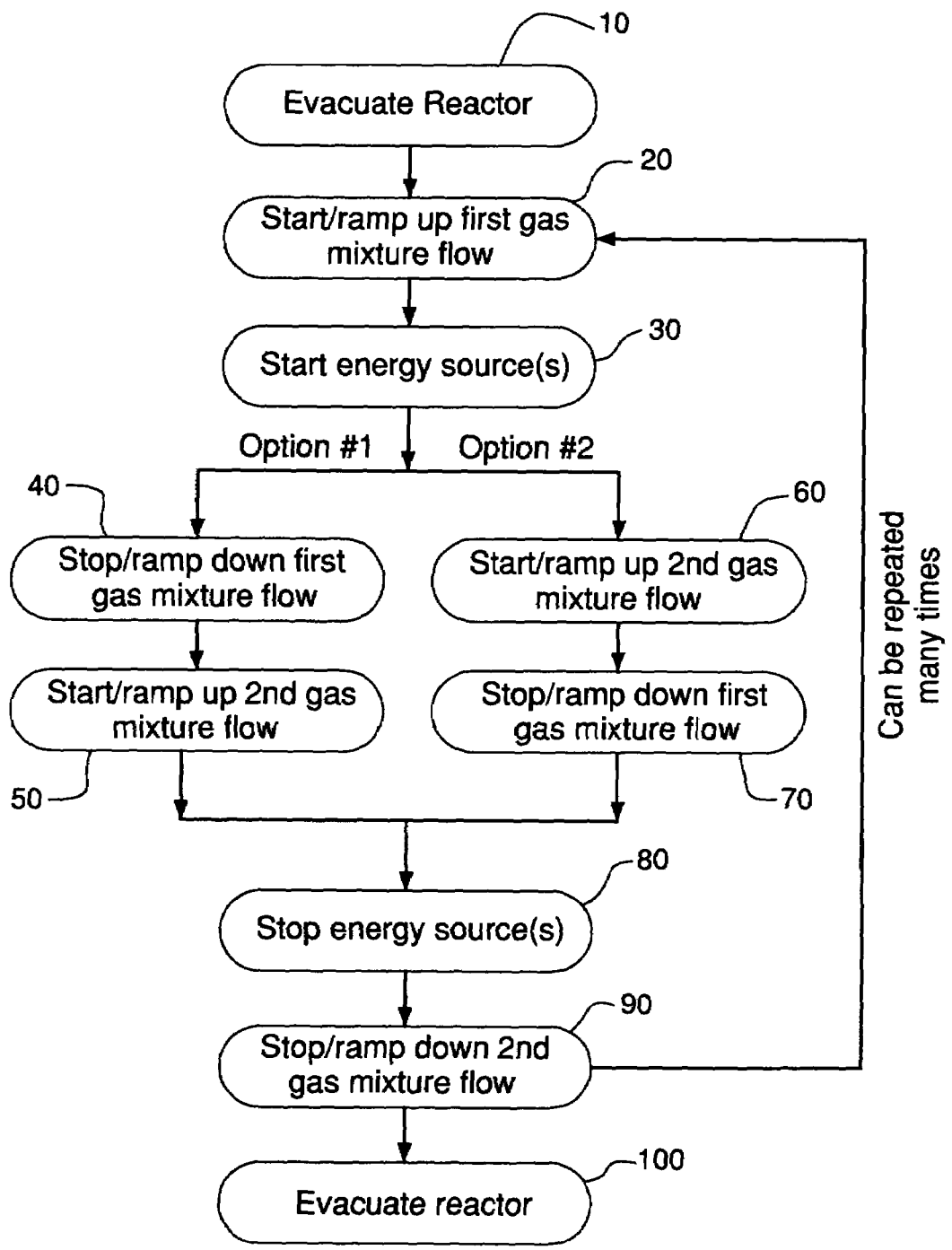
FIG. 1 provides a process flow diagram of one embodiment of the method of the present invention.

The inventive process is useful for dry-etching high dielectric constant materials and dry-cleaning chemical vapor deposition (CVD) reactors (and more specifically, ALD reactors) used to deposit high dielectric constant materials onto wafer surfaces. The material to be removed from the surface being etched or cleaned is converted from a solid non-volatile material into a material having higher volatility than the high dielectric constant materials deposited thereupon and can be subsequently removed, for example, by reactor vacuum pumps. The multiple-step process of the present invention involves using a first gas mixture comprising a boron-containing reactive agent to react with the substance to be removed and form a volatile product and a boron-containing by product. A second gas mixture comprising a fluorine-containing reactive agent is then employed to react with the boron-containing byproduct and form a volatile product. Thus, the substance is removed from a substrate using at least two reactive agents to volatilize the substance and/or the reaction by-products.

In certain embodiments, the process described herein may be useful for etching substances from at least a portion of the surface of a substrate. In these embodiments, suitable substrates may include, e.g., semiconductor wafers and the like. In other embodiments, the process described herein may be suitable for cleaning substances from substrates such as at least a portion of the surfaces of reaction chambers or reactors for CVD and/or ALD processes. The present invention is particularly suited for removing high dielectric constant substances that have deposited onto the exposed surfaces of a reactor or reaction chamber such as, for example, the workpiece platform, grounded sidewalls, and/or showerhead of a typical reaction chamber.

In certain embodiments, the substance to be removed can be a transition metal oxide, a transition metal silicate, a Group 13 metal oxide or a Group 13 metal silicate (in accordance with the IUPAC Nomenclature of Inorganic Chemistry, Recommendations 1990, Group 13 metals include Al, Ga, In and Tl, and the transition metals occupy Groups 3–12). The substance may be a high dielectric constant material having a dielectric constant greater than that of silicon dioxide (i.e., greater than about 4.1), or greater than 5, or at least 7. Preferably, the substance is at least one member selected from the group consisting of $Al_2O_3$, $HfO_2$, $ZrO_2$, $HfSi_xO_y$, $ZrSi_xO_y$, and mixtures thereof. Those skilled in the art will appreciate that the formula $HfSi_xO_y$ (and the formula $ZrSi_xO_y$) represents a mixture of $HfO_2$ ($ZrO_2$) and $SiO_2$, where x is greater than 0 and y is 2x+2.

In other embodiments of the present invention, the substance may be a laminate comprising layers of at least one member selected from the group of the following materials: a transition metal oxide, a transition metal silicate, a Group 13 metal oxide, a Group 13 metal silicate, a nitrogen containing transition metal oxide, a nitrogen containing transition metal silicate, a nitrogen containing Group 13 metal oxide, or a nitrogen containing Group 13 metal silicate. The laminate is preferably alternating between at least one of the foregoing materials and, optionally, other materials such as insulating materials. For example, the laminate may be comprised of alternating layers of $HfO_2$ and $Al_2O_3$. The laminate may also consist of a certain number of layers of a first material and a certain number of layers of a second material or, alternatively, outer layers of at least one first material and inner layers of at least one second material.

In yet a further embodiment of the present invention, the substance may be a nitrogen containing material such as a nitrogen containing transition metal oxide, a nitrogen containing transition metal silicate, a nitrogen containing Group 13 metal oxide, or a nitrogen containing Group 13 metal silicate. An example of this type of substance includes HfAlON.

As mentioned previously, the substance to be removed is reacted with a reactive agent to form a volatile product which can be readily removed from the substrate. In certain preferred embodiments, the reactive agent may be exposed to one or more energy sources sufficient to form active species, such as ions, radicals, excited neutrals, and the like, which react with the substance or reaction by-products and form the volatile product. Examples of suitable reactive agents include: a boron-containing gas and a fluorine-containing gas. Although the reactive agents used herein may be sometimes described as "gaseous", it is understood that the chemical reagents may be delivered directly as a gas to the reactor, delivered as a vaporized liquid, a sublimed solid and/or transported by an inert diluent gas into the reactor.

The reactive agents can be delivered to the reaction chamber by a variety of means, such as, for example, conventional cylinders, safe delivery systems, vacuum delivery systems, solid or liquid-based generators that create the reactive agent at the point of use. In one embodiment of the present invention, at least one reactive agent can be added to a non-reactive liquid or gaseous diluent and applied to the substrate having the substance to be removed as a spray or other means. The reactive agent can react with the substance to form the volatile product upon exposure to one or more energy sources. In an alternative embodiment such as for chamber cleaning applications, the reactive agent(s) can be deposited onto a non-reactive support which can be introduced into the reaction chamber. The material of the non-reactive support is one that will not react with the reactive agent prior to or during exposure to one or more energy sources. In certain preferred embodiments, the non-reactive support has a plurality of pores. The reactive agent(s) can be released upon exposure to one or more energy sources and react with the substance to be removed to form the volatile product.

As mentioned herein, the process removes high dielectric constant substances from a substrate by using a multiple-step process. In this connection, a first gas mixture containing a boron-containing reactive agent is used to convert the nonvolatile high dielectric constant substances into relatively more volatile species. This conversion is accomplished by contacting the substance to be removed with the first gas mixture containing a boron-containing reactive agent. Preferred examples of boron-containing reactive agents include $BCl_3$, $BBr_3$, $BI_3$, $BF_3$, and mixtures thereof. Among the foregoing, $BCl_3$ is the most preferred reactive agent. In these embodiments, $BCl_3$ is a liquefied gas at room temperature and can be readily delivered into the reaction chamber.

The following tables 1 through 10 show thermochemical calculations for boron-containing reactive agents. In these tables, $K_{eq}$ represents the equilibrium constant for the reaction as written; the larger the value of this constant, the more favorable the reaction will be to proceed.

TABLE 1

$Al_2O_3$ reaction with $BCl_3$: $Al_2O_3 + 2BCl_3(g) \leftrightarrow B_2O_3 + 2AlCl_3(g)$

| Temperature (° C.) | ΔH (Kcal) | ΔS (Cal) | ΔG (Kcal) | $K_{eq}$ |
|---|---|---|---|---|
| 0.000 | 9.561 | 12.274 | 6.208 | 1.078E−005 |
| 100.000 | 9.547 | 12.249 | 4.976 | 1.217E−003 |
| 200.000 | 9.424 | 11.959 | 3.766 | 1.822E−002 |
| 300.000 | 9.299 | 11.719 | 2.582 | 1.036E−001 |
| 400.000 | 9.196 | 11.553 | 1.419 | 3.461E−001 |
| 500.000 | 15.123 | 19.739 | −0.138 | 1.094E+000 |
| 600.000 | 15.476 | 20.169 | −2.135 | 3.422E+000 |
| 700.000 | 15.748 | 20.464 | −4.167 | 8.629E+000 |
| 800.000 | 15.951 | 20.664 | −6.224 | 1.852E+001 |
| 900.000 | 16.097 | 20.794 | −8.298 | 3.515E+001 |
| 1000.000 | 16.190 | 20.871 | −10.381 | 6.056E+001 |

TABLE 2

Thermodynamic data for reaction:
$1.5HfO_2 + 2BCl_3(g) = 1.5HfCl_4(g) + B_2O_3$

| T (° C.) | ΔH (kcal) | ΔS (kcal) | ΔG (kcal) | $K_{eq}$ |
|---|---|---|---|---|
| 0.000 | −17.999 | −12.638 | −14.547 | 4.367E+011 |
| 100.000 | −18.096 | −12.924 | −13.273 | 5.950E+007 |
| 200.000 | −18.268 | −13.335 | −11.959 | 3.346E+005 |
| 300.000 | −18.413 | −13.614 | −10.611 | 1.113E+004 |
| 400.000 | −18.507 | −13.765 | −9.241 | 1.001E+003 |
| 500.000 | −12.540 | −5.525 | −8.268 | 2.175E+002 |
| 600.000 | −12.126 | −5.020 | −7.743 | 8.672E+001 |
| 700.000 | −11.790 | −4.655 | −7.260 | 4.271E+001 |
| 800.000 | −11.524 | −4.395 | −6.808 | 2.436E+001 |
| 900.000 | −11.321 | −4.213 | −6.378 | 1.543E+001 |
| 1000.000 | −11.176 | −4.094 | −5.963 | 1.056E+001 |

TABLE 3

$ZrO_2$ reaction with $BCl_3$: $1.5ZrO_2 + 2BCl_3(g) \leftrightarrow 1.5ZrCl_4(g) + B_2O_3$

| Temperature (° C.) | ΔH (Kcal) | ΔS (Cal) | ΔG (Kcal) | $K_{eq}$ |
|---|---|---|---|---|
| 0.000 | −29.845 | −12.107 | −26.538 | 1.717E+021 |
| 25.000 | −29.825 | −12.038 | −26.236 | 1.710E+019 |
| 50.000 | −29.822 | −12.026 | −25.935 | 3.481E+017 |
| 75.000 | −29.828 | −12.047 | −25.634 | 1.239E+016 |
| 100.000 | −29.842 | −12.083 | −25.333 | 6.891E+014 |
| 125.000 | −29.858 | −12.126 | −25.030 | 5.502E+013 |
| 150.000 | −29.875 | −12.168 | −24.726 | 5.913E+012 |
| 175.000 | −29.892 | −12.207 | −24.422 | 8.142E+011 |
| 200.000 | −29.908 | −12.240 | −24.116 | 1.381E+011 |

TABLE 4

$ZrSiO_4$ reaction with $BCl_3$: $ZrSiO_4 + 2.667BCl_3(g) \leftrightarrow SiCl_4(g) + ZrCl_4(g) + 1.333B_2O_3$

| Temperature (° C.) | ΔH (Kcal) | ΔS (Cal) | ΔG (Kcal) | $K_{eq}$ |
|---|---|---|---|---|
| 0.000 | −31.065 | −21.096 | −25.303 | 1.764E+020 |
| 25.000 | −31.003 | −20.879 | −24.778 | 1.460E+018 |
| 50.000 | −30.962 | −20.747 | −24.258 | 2.554E+016 |
| 75.000 | −30.935 | −20.665 | −23.740 | 8.020E+014 |
| 100.000 | −30.916 | −20.613 | −23.224 | 4.013E+013 |
| 125.000 | −30.902 | −20.577 | −22.710 | 2.928E+012 |
| 150.000 | −30.891 | −20.549 | −22.196 | 2.914E+011 |
| 175.000 | −30.879 | −20.523 | −21.682 | 3.755E+010 |
| 200.000 | −30.867 | −20.496 | −21.169 | 6.012E+009 |
| 225.000 | −30.852 | −20.466 | −20.657 | 1.158E+009 |
| 250.000 | −30.835 | −20.432 | −20.146 | 2.612E+008 |
| 275.000 | −30.814 | −20.393 | −19.636 | 6.754E+007 |
| 300.000 | −30.790 | −20.349 | −19.127 | 1.967E+007 |
| 325.000 | −30.761 | −20.300 | −18.618 | 6.358E+006 |
| 350.000 | −30.729 | −20.247 | −18.112 | 2.252E+006 |
| 375.000 | −30.692 | −20.190 | −17.606 | 8.652E+005 |
| 400.000 | −30.652 | −20.130 | −17.102 | 3.572E+005 |
| 425.000 | −30.608 | −20.066 | −16.600 | 1.573E+005 |
| 450.000 | −22.891 | −9.391 | −16.100 | 7.349E+004 |
| 475.000 | −22.663 | −9.081 | −15.869 | 4.327E+004 |
| 500.000 | −22.443 | −8.791 | −15.646 | 2.649E+004 |

TABLE 5

$ZrSiO_4$ reaction with $BF_3$ and $BCl_3$: $ZrSiO_4 + 1.333BF_3(g) + 1.333BCl_3(g) \leftrightarrow SiF_4(g) + ZrCl_4(g) + 1.333B_2O_3$

| Temperature (° C.) | ΔH (Kcal) | ΔS (Cal) | ΔG (Kcal) | $K_{eq}$ |
|---|---|---|---|---|
| 0.000 | −25.010 | −21.014 | −19.270 | 2.627E+015 |
| 25.000 | −24.951 | −20.807 | −18.748 | 5.540E+013 |
| 50.000 | −24.912 | −20.681 | −18.229 | 2.136E+012 |
| 75.000 | −24.885 | −20.600 | −17.713 | 1.319E+011 |
| 100.000 | −24.865 | −20.545 | −17.199 | 1.186E+010 |
| 125.000 | −24.849 | −20.502 | −16.686 | 1.445E+009 |
| 150.000 | −24.833 | −20.463 | −16.174 | 2.260E+008 |
| 175.000 | −24.816 | −20.423 | −15.663 | 4.354E+007 |
| 200.000 | −24.796 | −20.380 | −15.153 | 9.992E+006 |
| 225.000 | −24.772 | −20.332 | −14.644 | 2.661E+006 |
| 250.000 | −24.745 | −20.278 | −14.136 | 8.053E+005 |
| 275.000 | −24.712 | −20.218 | −13.630 | 2.721E+005 |
| 300.000 | −24.675 | −20.152 | −13.125 | 1.012E+005 |
| 325.000 | −24.633 | −20.080 | −12.622 | 4.095E+004 |
| 350.000 | −24.586 | −20.003 | −12.121 | 1.784E+004 |
| 375.000 | −24.535 | −19.922 | −11.622 | 8.303E+003 |
| 400.000 | −24.478 | −19.837 | −11.125 | 4.095E+003 |
| 425.000 | −24.418 | −19.749 | −10.630 | 2.128E+003 |
| 450.000 | −16.684 | −9.050 | −10.139 | 1.160E+003 |
| 475.000 | −16.439 | −8.717 | −9.917 | 7.894E+002 |
| 500.000 | −16.201 | −8.405 | −9.703 | 5.535E+002 |

TABLE 6

Thermodynamic data for reaction: $1.5HfO_2 + 2BBr_3(g) = 1.5HfBr_4(g) + B_2O_3$

| T (° C.) | ΔH (kcal) | ΔS (kcal) | ΔG (kcal) | $K_{eq}$ |
|---|---|---|---|---|
| 0.000 | −53.997 | −10.093 | −51.241 | 1.003E+041 |
| 100.000 | −54.122 | −10.459 | −50.219 | 2.602E+029 |
| 200.000 | −54.371 | −11.049 | −49.143 | 5.026E+022 |
| 300.000 | −54.601 | −11.492 | −48.014 | 2.042E+018 |
| 400.000 | −54.773 | −11.770 | −46.850 | 1.629E+015 |
| 500.000 | −48.872 | −3.621 | −46.073 | 1.058E+013 |
| 600.000 | −48.508 | −3.178 | −45.734 | 2.806E+011 |
| 700.000 | −48.207 | −2.851 | −45.433 | 1.600E+010 |
| 800.000 | −47.960 | −2.609 | −45.161 | 1.577E+009 |
| 900.000 | −47.761 | −2.431 | −44.909 | 2.328E+008 |
| 1000.000 | −47.606 | −2.304 | −44.673 | 4.669E+007 |

TABLE 7

Thermodynamic data for reaction: $Al_2O_3 + 2BBr_3(g) = 2AlBr_3(g) + B_2O_3$

| T (° C.) | ΔH (kcal) | ΔS (kcal) | ΔG (kcal) | $K_{eq}$ |
|---|---|---|---|---|
| 0.000 | −2.212 | 12.687 | −5.678 | 3.493E+004 |
| 100.000 | −2.279 | 12.503 | −6.944 | 1.168E+004 |
| 200.000 | −2.482 | 12.022 | −8.170 | 5.945E+003 |
| 300.000 | −2.685 | 11.632 | −9.352 | 3.683E+003 |
| 400.000 | −2.852 | 11.362 | −10.501 | 2.567E+003 |
| 500.000 | 3.023 | 19.476 | −12.035 | 2.525E+003 |
| 600.000 | 3.337 | 19.858 | −14.003 | 3.200E+003 |
| 700.000 | 3.579 | 20.122 | −16.003 | 3.928E+003 |
| 800.000 | 3.764 | 20.30 | −18.024 | 4.688E+003 |
| 900.000 | 3.897 | 20.422 | −20.061 | 5.464E+003 |
| 1000.000 | 3.985 | 20.494 | −22.107 | 6.241E+003 |

TABLE 8

Thermodynamic data for reaction: $1.5HfO_2 + 2BI_3(g) = 1.5HfI_4(g) + B_2O_3$

| T (° C.) | ΔH (kcal) | ΔS (kcal) | ΔG (kcal) | $K_{eq}$ |
|---|---|---|---|---|
| 0.000 | −58.042 | −15.921 | −53.694 | 9.212E+042 |
| 100.000 | −58.342 | −16.842 | −52.057 | 3.104E+030 |
| 200.000 | −58.692 | −17.675 | −50.329 | 1.775E+023 |
| 300.000 | −58.991 | −18.250 | −48.531 | 3.214E+018 |
| 400.000 | −59.216 | −18.614 | −46.686 | 1.442E+015 |
| 500.000 | −53.362 | −10.530 | −45.221 | 6.080E+012 |
| 600.000 | −53.042 | −10.139 | −44.189 | 1.152E+011 |
| 700.000 | −52.784 | −9.859 | −43.190 | 5.015E+009 |
| 800.000 | −52.581 | −9.660 | −42.214 | 3.961E+008 |
| 900.000 | −52.429 | −9.524 | −41.256 | 4.856E+007 |
| 1000.000 | −52.324 | −9.438 | −40.308 | 8.315E+006 |

TABLE 9

Thermodynamic data for reaction: $1.5ZrO_2 + 2BBr_3(g) = 1.5ZrBr_4(g) + B_2O_3$

| T (° C.) | ΔH (kcal) | ΔS (kcal) | ΔG (kcal) | $K_{eq}$ |
|---|---|---|---|---|
| 0.000 | −44.096 | −11.573 | −40.935 | 5.691E+032 |
| 100.000 | −44.194 | −11.861 | −39.768 | 1.965E+023 |
| 200.000 | −44.363 | −12.264 | −38.560 | 6.495E+017 |
| 300.000 | −44.489 | −12.509 | −37.320 | 1.706E+014 |
| 400.000 | −44.545 | −12.600 | −36.064 | 5.125E+011 |
| 500.000 | −38.522 | −4.282 | −35.212 | 9.000E+009 |
| 600.000 | −38.033 | −3.686 | −34.815 | 5.186E+008 |
| 700.000 | −37.604 | −3.220 | −34.470 | 5.520E+007 |
| 800.000 | −37.229 | −2.853 | −34.167 | 9.096E+006 |
| 900.000 | −36.902 | −2.561 | −33.897 | 2.067E+006 |
| 1000.000 | −36.619 | −2.330 | −33.653 | 5.989E+005 |

TABLE 10

Thermodynamic data for reaction:
$1.5ZrO_2 + 2BI_3(g) = 1.5ZrI_4(g) + B_2O_3$

| T (° C.) | ΔH (kcal) | ΔS (kcal) | ΔG (kcal) | $K_{eq}$ |
|---|---|---|---|---|
| 0.000 | −74.430 | −11.695 | −71.235 | 1.001E+057 |
| 100.000 | −74.587 | −12.171 | −70.045 | 1.067E+041 |
| 200.000 | −74.805 | −12.689 | −68.801 | 6.053E+031 |
| 300.000 | −74.972 | −13.013 | −67.514 | 5.573E+025 |
| 400.000 | −75.065 | −13.163 | −66.204 | 3.134E+021 |
| 500.000 | −69.074 | −4.891 | −65.293 | 2.873E+018 |
| 600.000 | −68.614 | −4.330 | −64.833 | 1.695E+016 |
| 700.000 | −68.212 | −3.894 | −64.423 | 2.947E+014 |
| 800.000 | −67.861 | −3.549 | −64.052 | 1.110E+013 |
| 900.000 | −67.555 | −3.276 | −63.711 | 7.411E+011 |
| 1000.000 | −67.291 | −3.061 | −63.394 | 7.642E+010 |

As tables 1 through 10 illustrate, one of the byproducts of the reaction between the high k substance and the boron-containing reactive agent is $B_2O_3$. Boron-containing byproducts such as $B_2O_3$, along with other forms of solid boron-containing residues, may present problems in the end-product or cause processing equipment failure. To remedy this, a second gas mixture containing a fluorine-containing reactive agent is employed to react with boron byproducts and form volatile species, such as gaseous $BF_3$. Examples of fluorine-containing reactive agents include $NF_3$ (nitrogen trifluoride), $ClF_3$ (chlorine trifluoride), $ClF$ (chlorine fluoride), $SF_6$ (sulfur hexafluoride), perfluorocarbons such as $CF_4$ and $C_2F_6$ etc, hydrofluorocarbons such as $CHF_3$ and $C_3F_7H$ etc., oxyfluorocarbons such as $C_4F_8O$ (perfluorotetrahydrofuran) etc., hypofluorites such as $CF_3$—OF (fluoroxytrifluoromethane (FTM)) and FO—$CF_2$—OF (bis-difluoroxy-difluoromethane (BDM)) etc., fluoroperoxides such as $CF_3$—O—O—$CF_3$, F—O—O—F etc., fluorotrioxides such as $CF_3$—O— O—$CF_3$ etc., $COF_2$ (carbonyl flouride), NOF, $NF_xCl_{3-x}$, where x=1−2, and $F_2$ etc. In certain embodiments, $NF_3$ may be used because it is a non-corrosive gas, can be easily activated by plasma or thermal processes, and can achieve near-zero global warming emissions. In addition, $NF_3$ may minimize the generation of other solid contaminates. The following table 11 shows thermochemical calculations for the reaction between $B_2O_3$ and $NF_3$.

TABLE 11

$B_2O_3$ reaction with $NF_3$: $B_2O_3 + 2NF_3(g) \longleftrightarrow 2BF_3(g) + N_2(g) + O_2(g)$

| Temperature (° C.) | ΔH (Kcal) | ΔS (Cal) | ΔG (Kcal) | $K_{eq}$ |
|---|---|---|---|---|
| 0 | −175.738 | 103.229 | −203.935 | 1.53E+163 |
| 100 | −175.754 | 103.22 | −214.271 | 3.21E+125 |
| 200 | −176.137 | 102.324 | −224.552 | 5.37E+103 |
| 300 | −176.739 | 101.175 | −234.728 | 3.25E+89 |
| 400 | −177.498 | 99.957 | −244.784 | 3.02E+79 |
| 500 | −184.535 | 90.237 | −254.302 | 7.77E+71 |
| 600 | −185.946 | 88.52 | −263.237 | 7.83E+65 |
| 700 | −187.289 | 87.064 | −272.015 | 1.24E+61 |
| 800 | −188.578 | 85.802 | −280.656 | 1.45E+57 |
| 900 | −189.825 | 84.69 | −289.18 | 7.53E+53 |
| 1000 | −191.039 | 83.697 | −297.598 | 1.23E+51 |

In addition to the reactive agents described herein, inert diluent gases such as nitrogen, CO, helium, neon, argon, krypton, and xenon etc. can also be added into the first and/or second gas mixture. Inert diluent gases can be used, for example, to modify the plasma characteristics and cleaning processes to better suit some specific applications. In these embodiments, the concentration of the inert gases can range from 0 to 100%, or from 5 to 100%. In one embodiment, the concentration of $BCl_3$ was 100% (or 0% inert diluent gas) and the concentration of $NF_3$ was 15% (or 85% inert diluent gas). In another embodiment, the inert diluent is a reducing gas.

The first and second gas mixtures are exposed to one or more energy sources sufficient to generate active species to at least partially react with the substance and/or boron-containing by-products and form volatile species. The energy source for the exposing step may include, but not be limited to, α-particles, β-particles, γ-rays, x-rays, high energy electron, electron beam sources of energy; ultraviolet (wavelengths ranging from 10 to 400 nm), visible (wavelengths ranging from 400 to 750 nm), infrared (wavelengths ranging from 750 to $10^5$ nm), microwave (frequency>$10^9$ Hz), radio-frequency wave (frequency>$10^6$ Hz) energy; thermal; RF, DC, arc or corona discharge; sonic, ultrasonic or megasonic energy; and mixtures thereof.

In certain embodiments, thermal or plasma activation and/or enhancement can significantly impact the efficacy of dry etching and dry cleaning of high dielectric constant materials. For thermal activation, the substrate can be heated up to 600° C., or up to 400° C., or up to 300° C. The pressure range is generally from 10 mTorr to 760 Torr, or from 1 Torr to 760 Torr.

In certain embodiments, the reactive agent(s) are activated by a plasma in situ or within the reactor containing the substance and/or boron-containing by-products to be removed. For in situ plasma activation, one can generate the plasma with a 13.56 MHz RF power supply, with RF power density of at least 0.2 W/cm², or at least 0.5 W/cm², or at least 1 W/cm². One can also operate the in situ plasma at RF frequencies lower than 13.56 MHz to enhance ion assisted cleaning of grounded ALD chamber walls. The operating pressure is generally in the range of from 2.5 mTorr to 100 Torr, or from 5 mTorr to 50 Torr, or from 10 mTorr to 20 Torr. Optionally, one can also combine thermal and plasma enhancement for more effective cleaning of ALD chamber walls.

In alternative embodiments, a remote plasma source is used in addition to or in place of an in situ plasma to generate active species that are then introduced into the reactor. In these embodiments, the remote plasma source can be generated by either an RF or a microwave source. In addition, reactions between remote plasma generated reactive species and high dielectric constant materials can be activated/enhanced by heating ALD chamber components to elevated temperatures up to 600° C., or to 400° C., and or up to 300° C.

Other means of activation and enhancement to the cleaning processes can also be employed. For example, one can use photon induced chemical reactions to generate active species and enhance the etching/cleaning reactions.

In addition to being thermodynamicly favorable, a chemical reaction often requires an external energy source to overcome an activation energy barrier so that the reaction can proceed. The external energy source can be, for example, thermal heating or plasma activation. Higher temperatures can accelerate chemical reactions and make reaction byproducts more volatile. However, there may be practical limitations on temperature in production deposition chambers. Plasmas can generate more active species to facilitate reactions. Ions in the plasmas are accelerated by the electric field in the plasma sheath to gain energy. Energetic ions impinging upon surfaces can provide the energy needed to overcome reaction activation energy barrier. Ion bombardment also helps to volatize and remove reaction byproducts. These are common mechanisms in plasma etching/cleaning and reactive ion etching. Optionally, one can combine both thermal and plasma activation mechanisms to enhance the desired reactions for dry etching/cleaning of high dielectric constant materials. As an alternative to in situ plasma cleaning, one can use remote plasma source to generate more active species for cleaning high dielectric constant material residues from the deposition chambers. In addition, reactions between remote plasma generated reactive species and high dielectric constant materials can be activated and/or enhanced by heating CVD or ALD chamber components to elevated temperatures up to 600° C., or up to 400° C., or up to 300° C.

FIG. 1 provides a process flow diagram of one embodiment of the method of the present invention for chamber cleaning applications. In step 10, a substrate, such as a CVD or ALD reactor having a substance to be removed, is evacuated to a pressure, for example, of less than $10^{-5}$ torr. Next, in step 20, a first gas mixture comprising a boron-containing reactive agent is introduced into the reactor. In step 30, the first gas mixture is exposed to one or more energy sources such as thermal and/or plasma energy in order to induce reaction with the substance to be removed to form a volatile product and a boron-containing by-product. In steps 40 and 50, the first gas mixture is stopped or ramped down and the second gas mixture comprising a fluorine-containing reactive agent is started or ramped up, respectively. In an alternative embodiment, the second gas mixture is started in step 60 or ramped up and then the first gas mixture is stopped or ramped down in step 70. The boron-containing by-product is removed by the reaction with the fluorine-containing reactive agent in the second gas mixture and forms a volatile product. The volatile product is then removed from the reactor. Referring again to FIG. 1, the one or more energy sources is then stopped in step 80. In step 90, the second gas mixture is stopped or ramped down. Lastly, the reactor is evacuated in step 100 to a pressure of less than $10^{-5}$ torr thereby removing all of the residue and process gases from the reactor. It is understood that steps 20 through 90 may be repeated a plurality of times in order to remove the substance from the reactor.

In embodiments such as when there is a significant amount of high dielectric constant residues within the reactor, one can employ the first gas mixture comprising the boron-containing reactive agent in the first step over an extended period of time to remove the high dielectric constant residues. After the high dielectric constant materials have been removed satisfactorily, one can then employ the second gas mixture comprising the fluorine-containing reactive agent for a relatively shorter length of time than the first cleaning step to ensure that the boron residues are substantially removed from the chamber and the vacuum manifold. This process sequence may shorten the overall chamber clean time by minimizing the process gas change over time.

In still other embodiments, the exposure to the first and the second gas mixture may be conducted in short periods of time and then repeated a plurality of times to accomplish the cleaning process. This process sequence may shorten the overall chamber clean time by preventing non-volatile boron residues from passivating the chamber interior surfaces. Depending upon a variety of factors such as the selection of reactive agent, temperature, etc., the processing times for the exposure to the first and the second gas mixture may be optimized for rapid removal of high dielectric constant residues and for complete removal of boron residues.

The invention will be illustrated in more detail with reference to the following Examples, but it should be understood that the present invention is not deemed to be limited thereto.

EXAMPLES

The following are experimental examples of utilizing the above chemistries for cleaning of high dielectric constant materials. The experiments for examples 1 through 3 were conducted in a parallel plate capacitively coupled RF plasma. The gap space between the two electrodes was 1 inch. Sample coupons were prepared from wafers coated with high dielectric constant materials $Al_2O_3$, $HfO_2$, and $ZrO_2$ deposited by atomic layer deposition. For each experimental run, a sample coupon was put onto a carrier wafer and loaded onto the reactor chuck through a loadlock. Process gases were fed into the reactor from a top mounted showerhead. The chuck was then powered by a 13.56 MHz RF power source to generate the plasma in situ. The reactor is connected to a turbo pump through line. In the examples, reactor chuck was water cooled at 20° C.

During the one-step cleaning process, the reactor was evacuated to reach a baseline vacuum pressure; a process gas was introduced to reach a preset pressure; the RF power was activated for a preset time; the process gas was stopped; and the sample coupon/carrier wafer was retrieved. During the two-step cleaning process, the same steps were conducted after the reactor was evacuated except that a first process gas was introduced to reach a preset pressure; the RF power was activated for a preset time; the first process gas was stopped; the reactor was evacuated to reach baseline vacuum pressure; a second process gas was introduced to reach a preset pressure; the RF power was activated for a preset time; the second process gas was stopped; and the sample coupon/carrier wafer was retrieved.

The thickness of the high dielectric constant film on a coupon was measured by ellipsometry both before and after a timed exposure of the processing plasma. Change in high dielectric constant film thickness after plasma processing is used to calculate the etch rate. In addition to etch rate, plasma dc self bias voltage ($V_{bias}$) and the surface chemical composition was also measured. The surface chemical composition was measured using X-ray photoelectron spectroscopy (XPS). During the XPS analysis, the surfaces of the test coupons were examined initially by low-resolution survey scans to determine which elements were present. High-resolution spectra were acquired to determine the binding energy (i.e., chemical state) and concentration of the elements observed in the survey spectra. The quantification of the elements was accomplished by using the atomic sensitivity factors for a Physical Electronics Model 5700LSci ESCA spectrometer. The approximate escape depth ($3\lambda$ sin $\theta$) of the carbon electrons was 25 Å. The minimum detection limit for boron is 0.1 atom % for this instrument.

Example 1

One-Step Cleaning Using $BCl_3$

One-step cleaning experiments have been conducted for both $Al_2O_3$ and $HfO_2$ samples. Experimental conditions and results are listed in Table 12. The high-resolution XPS spectra for B1s are shown in FIGS. 2a and 2b. After the $BCl_3$ plasma etching step, there were boron residues remaining on the surfaces of both $Al_2O_3$ and $HfO_2$ samples and the boron residues existed as $B^{3+}$. The etch rate for $Al_2O_3$ and $HfO_2$ was 4.1 nm/min and 5.4 nm/min, respectively.

Example 2

One-Step Cleaning Using a Mixture of $BCl_3$ and $NF_3$

This present example was conducted to determine if a mixture of $BCl_3$ and $NF_3$ could eliminate the boron residues. Experimental conditions and results are provided in Table 12. High-resolution XPS spectra for B1s are shown in FIGS. 3a and 3b. As Table 12 illustrates, there was still boron residues remaining on the surfaces of both $Al_2O_3$ and $HfO_2$ samples.

Example 3

Two-Step Cleaning

In the present experiment, $BCl_3$ was used as the reactive agent in the first gas mixture and a mixture of $NF_3$ and He was used as the reactive agent for the second gas mixture. Table 12 provides the experimental conditions and results. FIGS. 4a and 4b shows the high-resolution XPS spectra for B1s. Within 1 minute for the $HfO_2$ sample and 3 minutes for the $Al_2O_3$ sample, the boron residues were removed to a level below the minimum detection limit (0.1 atom %) of the XPS instrument. The $Al_2O_3$ sample still had a boron residue of 0.2 atom % when the clean time for the second step was 1 minute.

TABLE 12

| Ex. | Material | Power Density (W/cm2) | Press. (mTorr) | First Process Gas Flow (sccm) | Second Process Gas Flow (sccm) | | Second Step Clean Time | Boron Residue (atomic %) |
|---|---|---|---|---|---|---|---|---|
| | | | | | $NF_3$ | He | | |
| 1 | $Al_2O_3$ | 0.55 | 500 | 10 ($BCl_3$) | 0 | 0 | 0 | 0.9% |
| 1 | $HfO_2$ | 0.55 | 500 | 10 ($BCl_3$) | 0 | 0 | 0 | 0.8% |
| 2 | $Al_2O_3$ | 0.55 | 500 | 11.25 ($BCl_3$); 3.75 ($NF_3$) | 0 | 0 | 0 | 0.8% |
| 2 | $HfO_2$ | 0.55 | 500 | 11.25 ($BCl_3$); 3.75 ($NF_3$) | 0 | 0 | 0 | 0.6% |
| 3 | $Al_2O_3$ | 0.55 | 500 | 10 ($BCl_3$) | 8.7 | 49.3 | 3 | <0.1 |
| 3 | $HfO_2$ | 0.55 | 500 | 10 ($BCl_3$) | 8.7 | 49.3 | 1 | <0.1 |

While the invention has been described in detail and with reference to specific examples thereof, it will be apparent to one skilled in the art that various changes and modifications can be made therein without departing from the spirit and scope thereof.

The invention claimed is:

1. A process for cleaning a substance from at least a portion of a surface of a reactor, the process comprising:
   introducing a first gas mixture comprising a boron-containing reactive agent into the reactor wherein the first gas mixture reacts with the substance contained therein to provide a volatile product and a boron-containing by-product wherein the substance comprises a dielectric constant greater than the dielectric constant of silicon dioxide;
   introducing a second gas mixture comprising a fluorine-containing reactive agent into the reactor wherein the second gas mixture reacts with the boron-containing by-product contained therein to form the volatile product; and
   removing the volatile product from the reactor; wherein the second introducing step is conducted upon the completion of the first introducing step.

2. The process of claim 1, wherein the reactor is an atomic layer deposition reactor.

3. The process of claim 1 wherein the removing step is conducted during at least a portion of the first and/or the second introducing steps.

4. The process of claim 1 wherein the first and the second introducing steps are alternated a plurality of times.

5. The process of claim 1, wherein the substance is at least one member selected from a transition metal oxide, a transition metal silicate, a Group 13 metal oxide, a Group 13 metal silicate, a nitrogen-containing Group 13 metal oxide, a nitrogen-containing Group 13 metal silicate, a nitrogen-containing transition metal oxide, a nitrogen-containing transition metal silicate, or a laminate comprising at least one layer of the group consisting of a transition metal oxide, a transition metal silicate, a Group 13 metal oxide, a Group 13 metal silicate, a nitrogen-containing Group 13 metal oxide, a nitrogen-containing Group 13 metal silicate, a nitrogen-containing transition metal oxide, a nitrogen-containing transition metal silicate, and mixtures thereof.

6. The process of claim 1, wherein the substance is at least one selected from $Al_2O_3$, $HfO_2$, $ZrO_2$, $HfSi_xO_y$, $ZrSi_xO_y$, and mixtures thereof, wherein x is a number greater than 0 and y is 2x+2, and any of the aforementioned compounds containing nitrogen.

7. The process of claim 1 wherein the boron-containing reactive agent is at least one selected from $BCl_3$, $BBr_3$, $BI_3$, $BF_3$, and mixtures thereof.

8. The process of claim 7, wherein the boron-containing reactive agent is $BCl_3$.

9. The process of claim 1, wherein the fluorine-containing reactive agent is at least one selected from $NF_3$, $ClF_3$, $ClF$, $SF_6$, a perfluorocarbon, a hydrofluorocarbon, an oxyfluorocarbon, a hypofluorite, a fluoroperoxide, a fluorotrioxide, $COF_2$, NOF, $F_2$, $NF_xCl_{3-x}$ wherein x is a number ranging from 1 to 2, and mixtures thereof.

10. The process of claim 9, wherein the fluorine-containing reactive agent is $NF_3$.

11. The process of claim 9, wherein the fluorine-containing reactive agent is $F_2$.

12. The process of claim 1, wherein the first gas mixture and/or the second gas mixture is conveyed to the reactor from at least one gas cylinder, a safe delivery system, or a vacuum delivery system.

13. The process of claim 1, wherein the first gas mixture and/or the second gas mixture is formed in situ by a point-of-use generator.

14. The process of claim 1, wherein the first gas mixture and/or the second gas mixture further comprises an inert gas diluent.

15. The process of claim 14, wherein the inert gas diluent is selected from nitrogen, CO, helium, neon, argon, krypton, xenon, and mixtures thereof.

16. A process for removing a substance from at least a portion of the surface of a reactor, the process comprising:
    providing the reactor wherein at least a portion of the surface is at least partially coated with the substance and wherein the substance has a dielectric constant of 4.1 or greater and is at least one member of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate, or a laminate comprising at least one layer of the group consisting of a transition metal oxide, a transition metal silicate, a Group 13 metal oxide, a Group 13 metal silicate, a nitrogen containing Group 13 metal oxide, a nitrogen containing Group 13 metal silicate, a nitrogen containing transition metal oxide, a nitrogen containing transition metal silicate;
    introducing a first gas mixture comprising a boron-containing reactive agent into the reactor;
    exposing the first gas mixture to one or more energy sources sufficient to generate active species that react with the substance and form a volatile product and a boron-containing byproduct; and
    introducing a second gas mixture comprising a fluorine-containing reactive agent into the reaction reactor;
    exposing the second gas mixture to one or more energy sources sufficient to generate active species that react with the boron-containing byproduct and form the volatile product; and
    removing the volatile product from the reactor; and the first gas mixture is exposed to one or more energy sources and the first exposing step is conducted prior to the second introducing step.

17. The process of claim 16 wherein the first gas mixture is exposed to one or more energy sources and the first exposing step is conducted during at least a portion of the first introducing step.

18. The process of claim 16 wherein the second gas mixture is exposed to one or more energy sources and the second exposing step is conducted during at least a portion of the second introducing step.

19. The process of claim 16 wherein a temperature of the first and/or second exposing step is at least 150° C.

20. The process of claim 16 wherein a pressure of the first and/or second exposing step is at least 10 mTorr.

21. A process for cleaning a substance comprising a dielectric constant greater than the dielectric constant of silicon dioxide from at least a portion of a surface of a reactor, the process comprising:
    introducing a first gas mixture comprising a boron-containing reactive agent into the reactor wherein the first gas mixture reacts with the substance contained therein to provide a volatile product and a boron-containing by-product comprising $B_2O_3$;
    introducing a second gas mixture comprising a fluorine-containing reactive agent into the reactor wherein the second gas mixture reacts with the boron-containing by-product contained therein to form the volatile product; and
    removing the volatile product from the reactor.

* * * * *